US009825185B1

(12) United States Patent
Li et al.

(10) Patent No.: US 9,825,185 B1
(45) Date of Patent: Nov. 21, 2017

(54) INTEGRATED CIRCUITS AND METHODS FOR FABRICATING INTEGRATED CIRCUITS WITH NON-VOLATILE MEMORY STRUCTURES

(71) Applicant: Globalfoundries Singapore Pte. Ltd., Singapore (SG)

(72) Inventors: Pinghui Li, Singapore (SG); Ming Zhu, Singapore (SG); Xinshu Cai, Singapore (SG); Fan Zhang, Singapore (SG); Danny Pak-Chum Shum, Singapore (SG); Darin Chan, Singapore (SG)

(73) Assignee: GLOBALFOUDNRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/383,048

(22) Filed: Dec. 19, 2016

(51) Int. Cl.
*H01L 29/788* (2006.01)
*H01L 29/06* (2006.01)
*H01L 29/78* (2006.01)
*H01L 29/10* (2006.01)
*H01L 29/423* (2006.01)
*H01L 23/522* (2006.01)
*H01L 29/66* (2006.01)
*H01L 29/08* (2006.01)

(52) U.S. Cl.
CPC ...... *H01L 29/7885* (2013.01); *H01L 23/5226* (2013.01); *H01L 29/0649* (2013.01); *H01L 29/0847* (2013.01); *H01L 29/1083* (2013.01); *H01L 29/42328* (2013.01); *H01L 29/66825* (2013.01); *H01L 29/7838* (2013.01)

(58) Field of Classification Search
CPC .......... H01L 29/7885; H01L 29/43328; H01L 29/42344
See application file for complete search history.

(56) References Cited

U.S. PATENT DOCUMENTS

| | | | |
|---|---|---|---|
| 9,583,356 B1* | 2/2017 | Liao .................... | H01L 21/3065 |
| 2011/0134698 A1* | 6/2011 | Mazure ............. | H01L 21/28273 |
| | | | 365/185.18 |
| 2012/0126309 A1* | 5/2012 | Yater .................... | H01L 27/105 |
| | | | 257/326 |

(Continued)

*Primary Examiner* — Benjamin Sandvik
*Assistant Examiner* — Farid Khan
(74) *Attorney, Agent, or Firm* — Lorenz & Kopf, LLP

(57) ABSTRACT

Integrated circuits and methods for fabricating integrated circuits with non-volatile memory structures are provided. An exemplary integrated circuit includes a semiconductor substrate having a central semiconductor-on-insulator (SOI) region between first and second non-SOI regions. The substrate includes a semiconductor base in the SOI region and the non-SOI regions, an insulator layer overlying the semiconductor base in the SOI region, and an upper semiconductor layer overlying the insulator layer in the SOI region. The integrated circuit further includes a first conductivity type well formed in the base in the first region and in a first portion of the SOI region, and a second conductivity type well formed in the base in the second region and in a second portion of the SOI region lateral of the first conductivity type well. Also, the integrated circuit includes a non-volatile memory device structure overlying the upper semiconductor layer in the SOI region.

20 Claims, 6 Drawing Sheets

(56) References Cited

U.S. PATENT DOCUMENTS

| | | | |
|---|---|---|---|
| 2013/0062680 A1* | 3/2013 | Kato | H01L 29/66825 257/316 |
| 2014/0048897 A1* | 2/2014 | Qian | H01L 27/1463 257/431 |
| 2015/0318287 A1* | 11/2015 | Sugino | H01L 21/32136 257/296 |

* cited by examiner

INTEGRATED CIRCUITS AND METHODS FOR FABRICATING INTEGRATED CIRCUITS WITH NON-VOLATILE MEMORY STRUCTURES

TECHNICAL FIELD

The technical field generally relates to integrated circuits, and more particularly relates to integrated circuits with non-volatile memory structures, such as flash memory structures.

BACKGROUND

Non-volatile memory, such as, for example, flash memory, may be used in various storage devices, such as, for example, secure digital memory cards (SD cards), USB sticks, solid state drives (SSDs), and internal memory of various electronic devices, such as, for example, mobile phones, tablet computers, media players, etc. Further applications of non-volatile memory include embedded systems, such as microcontrollers, wherein a non-volatile memory device may be integrated on a same semiconductor structure as other circuitry of a microcontroller, such as, for example, volatile memory, a CPU and/or input/output devices.

Types of non-volatile memory devices include split gate non-volatile memory devices, which may include a plurality of split gate non-volatile memory cells that are typically arranged in an array and are electrically connected to electrically conductive lines extending along columns and rows of the array. The electrically conductive lines may be used for programming, erasing and/or reading the split gate non-volatile memory cells.

For reading data from a split gate non-volatile memory cell, the source region may be grounded, and relatively small positive voltages of, for example, about 1 V may be applied to the select gate electrode, the control gate electrode and the drain. The channel region between the source region and the drain region may be influenced by the electrical charges stored at the charge storage layer, so that a current that is representative of the data stored in the split gate non-volatile memory cell flows between the drain region and source region of the split gate non-volatile memory cell.

For programming split gate non-volatile memory cells, a source side injection of charge carriers into the charge storage layer may be performed. For this purpose, the drain region of the split gate non-volatile memory cell may be grounded, a relatively high positive voltage of, for example, about 4 V may be applied to the source region, and an even higher positive voltage, for example a voltage in a range from about 6-9 V, may be applied to the control gate electrode. A voltage slightly greater than the threshold voltage of the channel region of the split gate non-volatile memory cell may be applied to the select gate electrode.

The split gate non-volatile memory cell may be erased by Fowler-Nordheim tunneling. For this purpose, a negative bias may be applied between the control gate electrode and the source and drain regions. For example, a relatively high negative voltage of, for example, about −6 V may be applied to the control gate electrode, and a relatively high positive voltage of, for example, about 6 V may be applied to each of the source region and the drain region. A relatively high positive voltage of, for example, about 5 V may be applied to the select gate electrode.

Known split gate non-volatile memory devices may have issues associated therewith. For example, such non-volatile memory devices require a lot of chip space. Further, current non-volatile memory devices suffer several limitations, such as scalability issues or program disturbance.

Accordingly, it is desirable to provide integrated circuits with improved non-volatile memory structures. It is also desirable to provide non-volatile memory structures with improved scalability, increased program/erase speed, minimized program disturbance and with improved endurance. Further, it is desirable to provide a method for fabricating an integrated circuit including a non-volatile memory structure that is cost effective and time efficient. Furthermore, other desirable features and characteristics will become apparent from the subsequent detailed description and the appended claims, taken in conjunction with the accompanying drawings and this background.

BRIEF SUMMARY

Integrated circuits and methods for fabricating integrated circuits with non-volatile memory structures are provided. In an embodiment, an integrated circuit includes a semiconductor substrate having a central semiconductor-on-insulator (SOI) region between a first non-SOI region and a second non-SOI region. The semiconductor substrate includes a semiconductor base in the central SOI region and the non-SOI regions, an insulator layer overlying the semiconductor base in the central SOI region, and an upper semiconductor layer overlying the insulator layer in the central SOI region. The integrated circuit further includes a first conductivity type well formed in the semiconductor base in the first non-SOI region and in a first portion of the central SOI region, and a second conductivity type well formed in the semiconductor base in the second non-SOI region and in a second portion of the central SOI region lateral of the first conductivity type well. Also, the integrated circuit includes a non-volatile memory device structure overlying the upper semiconductor layer in the central SOI region.

In another exemplary embodiment, an integrated circuit includes a semiconductor base having a first region, a second region, and a central region located between the first region and the second region. The integrated circuit further includes an insulator layer directly overlying the central region of the semiconductor base and an upper semiconductor layer directly overlying the insulator layer. Also, the integrated circuit includes a first lateral semiconductor layer directly overlying the first region of the semiconductor base and a second lateral semiconductor layer directly overlying the second region of the semiconductor base. The first lateral, upper, and second lateral semiconductor layers define an upper surface. Further, the integrated circuit includes a first isolation region extending from the upper surface and into the semiconductor base and insulating the upper semiconductor layer from the first lateral semiconductor layer and a second isolation region extending from the upper surface and into the semiconductor base and insulating the upper semiconductor layer from the second lateral semiconductor layer. The integrated circuit also includes a non-volatile memory device structure directly overlying the upper semiconductor layer.

In yet another exemplary embodiment, a method for fabricating an integrated circuit is provided. The method includes providing a semiconductor-on-insulator (SOI) substrate including a semiconductor base, an insulator layer overlying the semiconductor base, and an upper semiconductor layer overlying the insulator layer. The SOI substrate has a first region, a second region, and a central region between the first region and the second region. The method includes removing the upper semiconductor layer and the insulator layer from the first and second regions. Also, the method includes forming a first isolation region at a first end of the upper semiconductor layer and the insulator layer and a second isolation region at a second end of the upper semiconductor layer and the insulator layer. Further, the method includes doping the semiconductor base in the first region and a first portion of the semiconductor base in the central region with a first conductivity type dopant and doping the semiconductor base in the second region and a second portion of the semiconductor base in the central region with a second conductivity type dopant. The method also includes forming a non-volatile memory device structure directly overlying the upper semiconductor layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
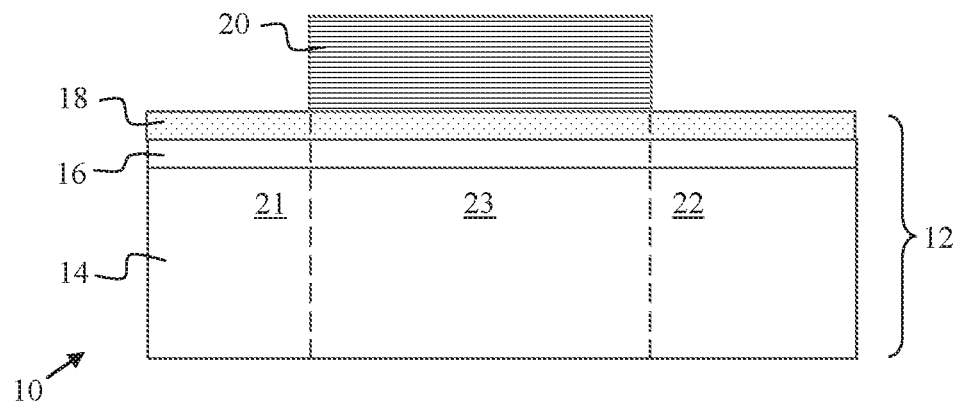
FIGS. 1-15 illustrate cross sectional views of portions of an integrated circuit and methods for fabricating the same including formation of a non-volatile memory structure according to various embodiments herein.

The following detailed description is merely exemplary in nature and is not intended to limit the integrated circuits with non-volatile memory structures or methods for fabricating integrated circuits with non-volatile memory structures. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer.

Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

In accordance with the various embodiments herein, integrated circuits including non-volatile memory structures and methods for fabricating integrated circuits with non-volatile memory structures are provided. Generally, the following embodiments relate to the formation of an integrated circuit over a semiconductor-on-insulator (SOI) substrate having an underlying bulk or base layer. Particular embodiments of an exemplary method include removing the insulator and upper semiconductor layers in selected areas of the substrate and forming additional semiconductor material on the base layer. Portions of the non-volatile memory structure and/or well contacts may be formed over the additional semiconductor material such that those portions or regions do not lie over an insulator layer of the SOI substrate.

Embodiments provided herein provide non-volatile memory structures over partially depleted SOI (PDSOI) or fully depleted SOI (FDSOI) layers. When a layer has a thickness that is sufficiently thin, such as less than 90 nm thick, the layer is partially depleted of mobile charge carriers. For an even thinner layer, such as a layer less than 20 nm thick or about one-quarter of a respective channel length, the layer is fully depleted of mobile charge carriers, i.e., includes no detectable mobile charge carriers. Partially or fully depleted layers provide excellent gate control due to the ultra-thin body region formed by the upper semiconductor layer. Further, use of such layers allows for forward-bias and back-bias control through the bulk layer underlying the SOI insulator layer.

FIGS. 1-15 illustrate cross sectional views of processing of a portion of an integrated circuit 10 for forming a non-volatile memory structure according to an embodiment herein. The exemplary integrated circuit 10 includes a semiconductor substrate 12. As used herein, the term "semiconductor substrate" encompasses substrates formed from semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is silicon, such as crystalline silicon. While the substrate may be a bulk silicon wafer, in the illustrated embodiment the substrate is a silicon-on-insulator or SOI substrate.

As shown, the semiconductor substrate 12 includes a carrier wafer or base 14. An exemplary base 14 is formed from a semiconductor material as described above. For example, the base 14 may be silicon. A thin insulator layer 16 is formed over the base 14 according well-known processing. An exemplary insulator layer 16 includes silicon oxide, commonly referred to as buried oxide (BOX), or other suitable insulator material. As used herein, an insulator material refers to a material having a resistivity greater than $1.0 \times 10^3$ Ohm-cm. As is further shown, a thin upper layer 18 is formed over the insulator layer 16 according to well-known processing. In an exemplary embodiment, the upper layer 18 has a thickness of from about 5 nm to about 50 nm, such as from about 5 nm to about 20 nm. An exemplary upper layer 18 is formed from a semiconductor material as described above, such as silicon.

In FIG. 1, a mask 20 is formed and patterned over the semiconductor substrate 12. For example, a photoresist layer (not shown) may be deposited and patterned over the semiconductor substrate 12 to form the mask 20. The mask 20 is patterned to expose a first lateral region 21 and a second lateral region 22 of the semiconductor substrate 12, and to cover a central region 23 of the semiconductor substrate 12 located between the first lateral region 21 and the second lateral region 22.

Figure 2:
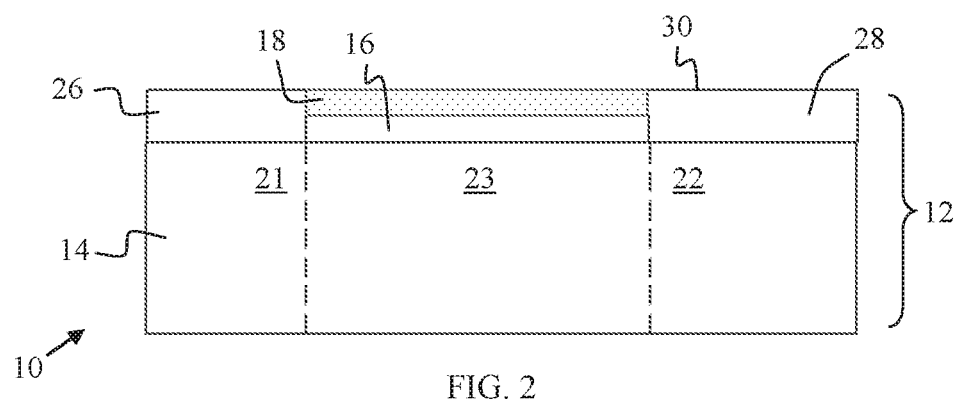

In FIG. 2, an etch process is performed to remove the upper layer 18 and the insulator layer 16 and to expose the underlying base 14 in the first and second lateral regions 21 and 22. A conventional wet or dry etch may be used to selectively remove the upper layer 18 and a conventional wet or dry etch may be used to selectively remove the insulator layer 16, using convention etchants that are selective to the type of material in the upper layer 18 and the insulator layer 16, respectively.

Further shown in FIG. 2, semiconductor material is deposited over the base 14 in the first and second lateral regions 21 and 22 to form a first lateral semiconductor layer 26 and a second lateral semiconductor layer 28. respectively. In an exemplary embodiment, the semiconductor material forming the first and second lateral semiconductor layers 26 and 28 is grown by an epitaxial process. In an exemplary embodiment, the epitaxial semiconductor material forming the first and second lateral semiconductor layers 26 and 28 is the same material as the base 14. For example, the semiconductor material forming the first and second lateral semiconductor layers 26 and 28 may be silicon. A planarization process may be used to form the first and second lateral semiconductor layers 26 and 28 and the upper layer 18 with a common planar surface 30. As constructed, the first and second lateral regions 21 and 22 are formed without a semiconductor layer overlying an insulator layer and are considered non-SOI regions while the central region 23 retains the semiconductor layer overlying an insulator layer 16 and is considered an SOI region.

Figure 3:
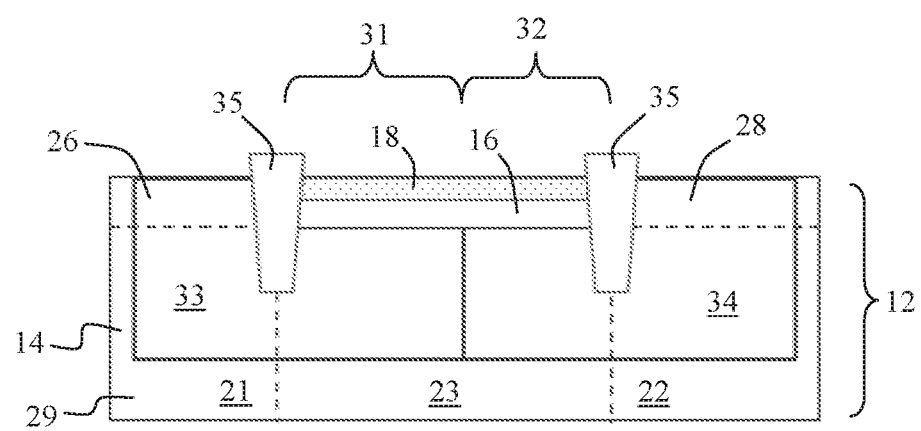

In FIG. 3, doping processes such as ion implantation processes are performed to selectively dope regions of the semiconductor substrate 12. For example, dopants may be implanted into the semiconductor substrate 12 to form a deep well region 29. In an exemplary embodiment, second conductivity dopants (e.g., N-type dopants such as phosphorus at a concentration of $1E18 \text{ cm}^{-3}$, may be implanted to form a deep well region 29 of the second conductivity type. Further, a mask (not shown) may be deposited and patterned over the semiconductor substrate 12 to expose the first lateral region 21 and a first portion 31 of the central region 23 and to cover the second lateral region 22 and a second portion 32 of the central region 23. Then, dopants may be implanted into the non-masked first lateral region 21 and first portion 31 of the central region 23 to form a doped well region 33. In an exemplary embodiment, first conductivity dopants (e.g., P-type dopants such as boron at a concentration of $1E18 \text{ cm}^{-3}$, may be implanted to form a doped well region 33 of the first conductivity type. The mask may then be removed.

Further, another mask (not shown) may be deposited and patterned over the semiconductor substrate 12 to cover the first lateral region 21 and the first portion 31 of the central region 23 and to expose the second lateral region 22 and the second portion 32 of the central region 23. Then, dopants may be implanted into the non-masked second lateral region 22 and the second portion 32 of the central region 23 to form a second doped well region 34. In an exemplary embodiment, second conductivity dopants (e.g., N-type dopants) may be implanted to form the second doped well region 34 of the second conductivity type. Then the mask may be removed.

In an exemplary embodiment, the ion implantation processes are performed at a depth greater than the depth of upper layer 18. Therefore, the upper layer 18 has little or no detectable dopant of the doped regions 29, 33 and 34, despite not being completely masked during the implantation process for forming well regions 29, 33 and 34. The undoped upper layer 18 forms a fully depleted, or at least partially depleted, region of undoped semiconductor material that may be used as a channel region for later formed gate structures.

As further shown in FIG. 3, an exemplary embodiment includes forming shallow trench isolation (STI) regions 35 in the semiconductor substrate 12. Such regions 35 may be formed according to conventional methods, including masking the semiconductor substrate 12 and etching shallow trenches through the upper layer 18 and the insulator layer 16 and/or through the lateral semiconductor layers 26 and 28, and into the underling base 14. Thereafter, an insulating material may be deposited over the semiconductor substrate 12 to fill the trenches and form the STI regions 35. An exemplary insulating material is silicon oxide. An exemplary deposition process is chemical vapor deposition (CVD). A planarization process may remove an overburden of the insulating material to form the isolation regions 35 in the semiconductor substrate 12. As shown, the isolation regions 35 separates the central region 23 from the first and second lateral regions 21 and 22, at least to the depth of the isolation regions 35. Also, the upper layer 18 and the insulator layer 16 extend from the isolation region 35 at the first lateral region 21 to the isolation region 35 at the second lateral region 22 such that the upper layer 18 and the insulator layer 16 are separated and isolated from the first and second lateral regions 21 and 22 by the isolation regions 35. While in the illustrated embodiment the isolation regions 35 are formed after doping, in other embodiments the isolation regions 35 may be formed before doping the well regions 33 and 34.

Figure 4:
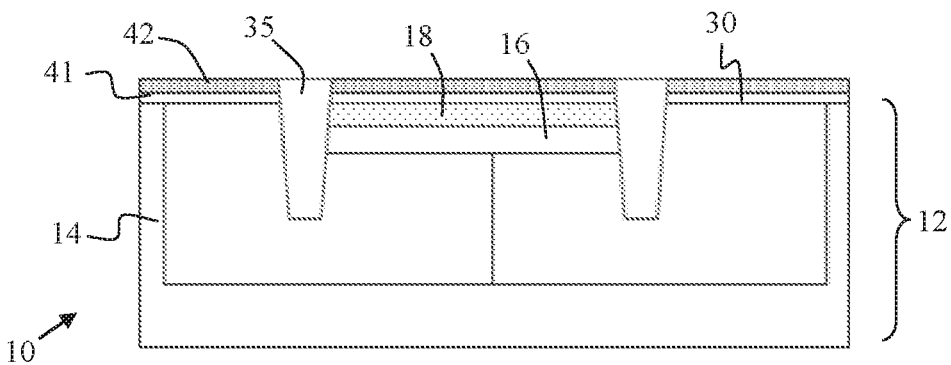

In FIG. 4, a layer of gate insulator 41 is formed on the surface 30 of the semiconductor substrate 12. The gate insulator 41 may be thermally grown silicon oxide formed by heating the semiconductor substrate 12 in an oxidizing ambient, or may be a deposited insulator such as a silicon oxide or a high k dielectric insulator such as hafnium silicon oxide, or the like. As used herein, a high k dielectric is a dielectric having a dielectric constant greater than 3.9. Deposited insulators can be deposited in a known manner, for example, by chemical vapor deposition (CVD), low pressure chemical vapor deposition (LPCVD), semi-atmospheric chemical vapor deposition (SACVD), or plasma enhanced chemical vapor deposition (PECVD). Gate insulator 41 is illustrated as a thermally grown silicon oxide layer. The gate insulator 41 may be from about 1 to about 10 nm, such as from about 8 to about 10 nm, in thickness. For use in a floating gate, the gate insulator 41 may be considered to be tunnel oxide.

In accordance with one embodiment, a layer of gate electrode material 42, such as polycrystalline silicon, is deposited onto the layer of gate insulator 41. The gate electrode material 42 may be hereinafter referred to as polycrystalline silicon although those of skill in the art will recognize that other materials can be employed. If the gate electrode material 42 is polycrystalline silicon, that material is typically deposited to a thickness of from about 50 to about 200 nm. In an exemplary embodiment, the polycrystalline silicon is deposited to a thickness of about 100 nm by LPCVD through the hydrogen reduction of silane. In an exemplary embodiment, the layer of polycrystalline silicon is deposited as undoped polycrystalline silicon and is subsequently impurity doped by ion implantation. The gate electrode material 42 may be used as a floating gate electrode as described below.

Figure 5:
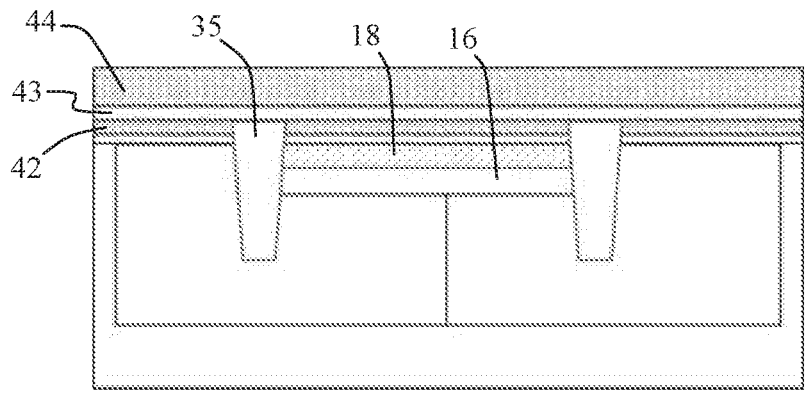

In FIG. 5, an inter-gate dielectric layer 43 is formed over the gate electrode material 42. An exemplary inter-gate dielectric layer 43 is a high k dielectric. For example, the inter-gate dielectric layer 43 is an oxide-nitride-oxide (ONO) film, though another high k dielectric, for example hafnium oxide ($HfO_2$) or (ISSG), may be used. An ONO film may be formed by depositing a first layer of silicon dioxide, depositing a layer of silicon nitride on top of the silicon dioxide, and forming a second layer of silicon dioxide on the nitride layer. The second oxide layer is typically grown in a thermal oxidation process, such as a steam oxidation, of the nitride layer. After gate formation, the inter-gate dielectric layer 43 may insulate the floating gate from the control gate.

As shown, a layer of gate electrode material 44 is formed over the inter-gate dielectric layer 43. The gate electrode material 44 may be used as a control gate electrode as described below. An exemplary gate electrode material 44 is polycrystalline silicon, though other suitable materials may be used. The gate electrode material 44 may be formed by LPCVD through the hydrogen reduction of silane. In an exemplary embodiment, the gate electrode material 44 is formed with a thickness of from about 50 to about 100 nm, such as about 80 nm.

Figure 6:
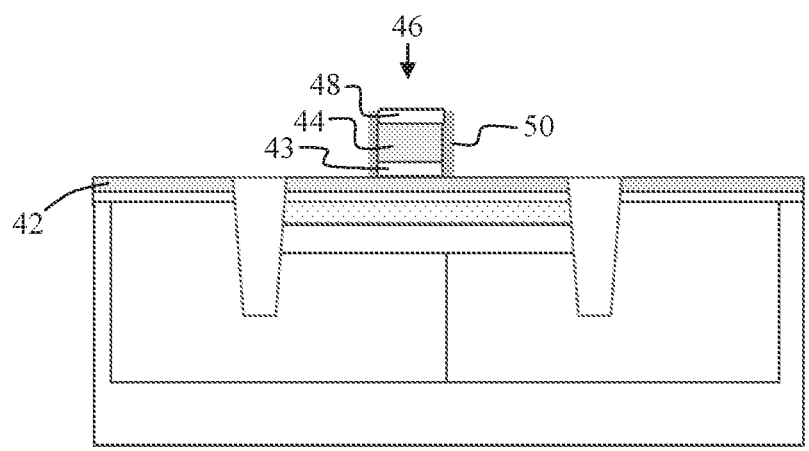

The method may continue in FIG. 6 with patterning of the gate electrode material 44 and the inter-gate dielectric layer 43. For example, a hard mask (not shown) may be formed and used to pattern the gate electrode material 44 and the inter-gate dielectric layer 43 according to conventional techniques. As a result, a control gate structure 46 is formed. An exemplary control gate structure 46 has a thickness of about 80 nm. The control gate structure 46 may include a cap 48, such as a silicon nitride cap, as is formed in conventional gate etch processing prior to patterning of the gate electrode material 44 and the inter-gate dielectric layer 43. As shown, spacers 50 are formed around the control gate structure 46. For example, a spacer material may be conformally deposited and etched to form spacers 50 according to conventional techniques. Exemplary spacers 50 are formed from a suitable dielectric material, such as silicon nitride.

Figure 7:
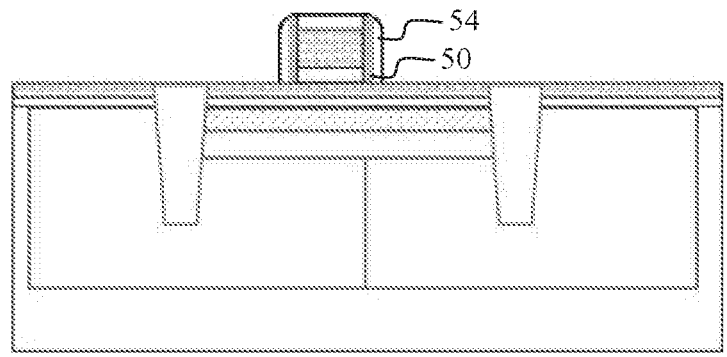

In FIG. 7, a sidewall spacer 54 is formed adjacent the spacers 50. An exemplary sidewall spacer 54 is formed from a suitable dielectric material, such as silicon oxide. In an exemplary embodiment, silicon oxide is conformally deposited, such as by LPCVD, and is etched to form the sidewall spacer 54.

Figure 8:
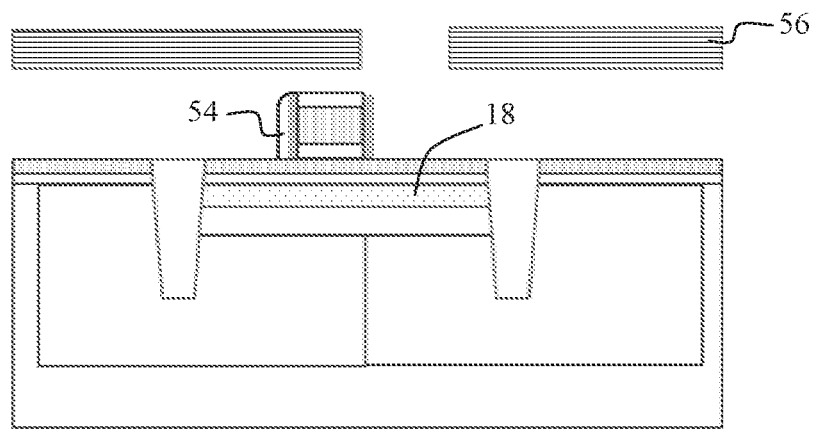

A mask or reticle 56 is positioned over the partially fabricated integrated circuit 10 in FIG. 8 and an optional doping process is performed. Specifically, an optional implantation process is performed to adjust the voltage threshold of a later-formed word line. During the optional doping process, upper layer 18 is doped. After the word line implantation process, the sidewall spacer 54 exposed by the reticle 56 is removed as shown.

Figure 9:
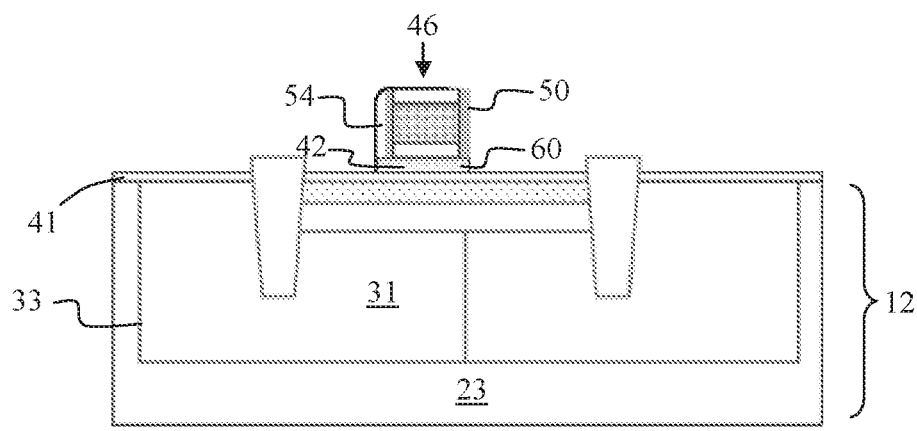

Then, in FIG. 9, the gate electrode material 42 is etched, using the remaining sidewall spacer 54, spacers 50 and the control gate structure 46 as a mask. As a result, a floating gate structure 60 is formed. An exemplary floating gate structure 60 has a thickness of about 40 nm. The floating gate structure 60 is formed directly over doped well region 33 in the first portion 31 of the central region 23 of the semiconductor substrate 12.

Figure 10:
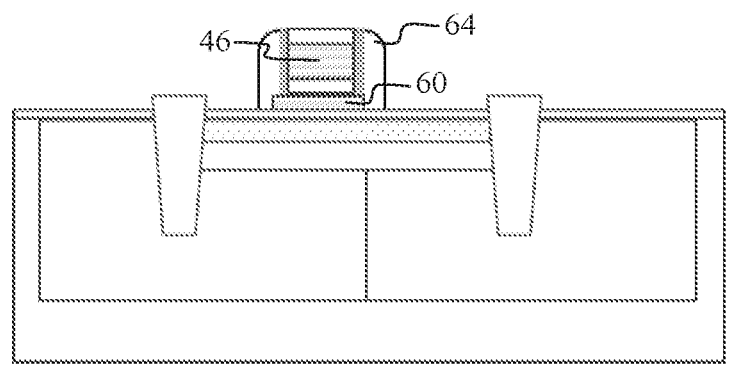

The remaining sidewall spacer 54 is then removed as shown in FIG. 10. Then, another sidewall spacer 64 is formed around the stack of the control and floating gate structures 46 and 60. An exemplary sidewall spacer 64 is formed from a suitable dielectric material, such as silicon oxide. In an exemplary embodiment, silicon oxide is conformally deposited, such as by LPCVD, and is etched to form the sidewall spacer 64.

Figure 11:
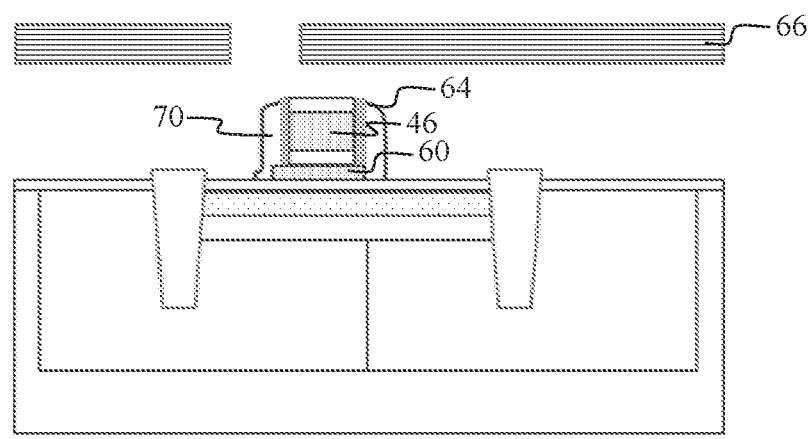

In FIG. 11, a mask or reticle 66 is positioned over the partially fabricated integrated circuit 10 and a source/drain doping process is performed. After the implantation process, the sidewall spacer 64 exposed by the reticle 66 is removed. Then, a sidewall tunnel oxide layer 70 is formed alongside the stack of the control gate structure 46 and floating gate structure 60.

Figure 12:
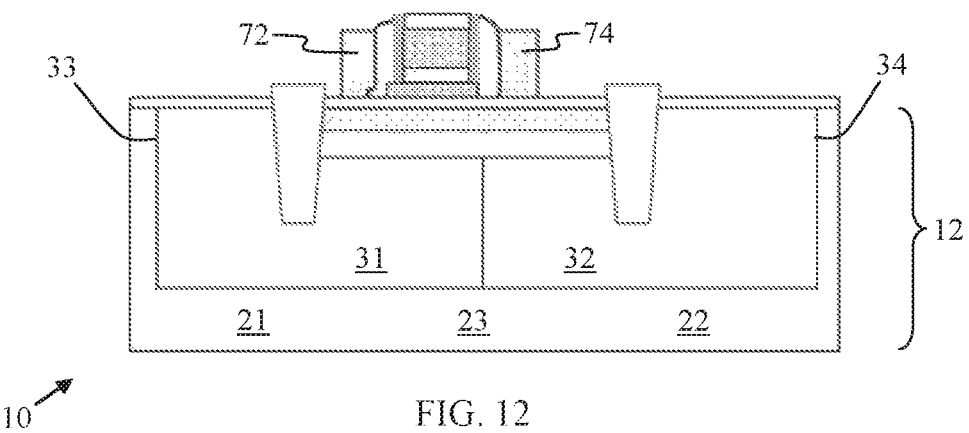

In FIG. 12, a layer of gate electrode material is deposited over the partially fabricated integrated circuit 10. In an exemplary embodiment, the gate electrode material is polycrystalline silicon, although other materials can be employed. If the gate electrode material is polycrystalline silicon, that material is typically deposited to a thickness of from about 50 to about 400 nm, such as about 100 nm. In an exemplary embodiment, the polycrystalline silicon is deposited by LPCVD through the hydrogen reduction of silane. In an exemplary embodiment, the layer of polycrystalline silicon is deposited as undoped polycrystalline silicon and is subsequently impurity doped by ion implantation. As shown, the gate electrode material is patterned to form an erase gate structure 72 and a select gate structure 74. A conventional gate etch process using appropriate masking and lithography techniques may be used. The exemplary erase gate structure 72 is formed directly over doped well region 33 in the first portion 31 of the central region 23 of the semiconductor substrate 12. Further, the exemplary select gate structure 74 is formed directly over doped well region 34 in the second portion 32 of the central region 23 of the semiconductor substrate 12. The erase gate structure 72 is laterally adjacent the stack of the control gate structure 46 and floating gate structure 60. The select gate structures 74 is laterally adjacent the stack of the control gate structure 46 and floating gate structure 60.

Figure 13:
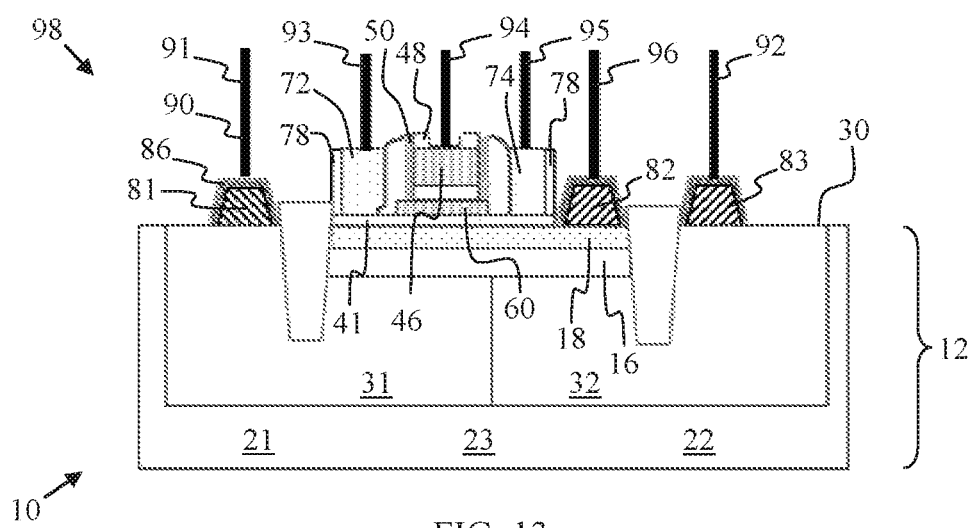

In FIG. 13, a spacer 78 is formed around the erase gate structure 72 and the select gate structure 74. In an exemplary embodiment, the spacer 78 is a high k dielectric, e.g., an oxide-nitride-oxide (ONO) film, though another high k dielectric may be used. An ONO film may be formed by depositing a first layer of silicon dioxide, depositing a layer of silicon nitride on top of the silicon dioxide, and forming a second layer of silicon dioxide on the nitride layer. The second oxide layer is typically grown in a thermal oxidation process, such as a steam oxidation, of the nitride layer.

As shown, portions of the gate insulator 41 not covered by the spacer 78, erase gate structure 72, control gate structure 46, and select gate structure 74 are removed. Contact regions 81, 82, and 83 may then be formed over surface 30 of the semiconductor substrate 12. Specifically, contact regions 81, 82, and 83 are formed on exposed semiconductor regions of the partially fabricated integrated circuit 10. For example, the contact region 81 may be formed on the surface 30 of the first lateral region 21. An exemplary contact region 81 is silicon germanium (SiGe). In an exemplary embodiment, the contact region 81 is a raised region formed by epitaxial deposition. Further, in an exemplary embodiment, the contact region 81 is formed by an in situ doped epitaxial deposition process. In an exemplary embodiment, the contact region 81 is heavily doped with a first conductivity type dopant, e.g., is heavily P doped (P+). As used herein, "heavily" refers to doped layers having more than one dopant atom per one-hundred thousand atoms of semiconductor (such as silicon).

During formation of the contact region 81, the central region 23 and second lateral region 22 of the partially fabricated integrated circuit 10 are masked. Then, the second lateral region 22 and the central region 23 may be unmasked and the first lateral region 21 may be masked during formation of contact regions 82 and 83.

As shown, contact region 82 is formed on the surface of the fully depleted upper layer 18 that is not covered by the spacer 78 or gate structures. Further, contact region 83 is formed on the surface 30 of the second lateral region 22. In an exemplary embodiment, contact regions 82 and 83 are formed from a same material and are formed simultaneously during a same process. Alternatively, contact regions 82 and 83 may be independently formed by masking and unmasking selected portions of second lateral region 22. Exemplary contact regions 82 and 83 are silicon phosphorus (SiP). In an exemplary embodiment, the contact regions 82 and 83 are raised regions formed by epitaxial deposition. Further, in an exemplary embodiment, the contact regions 82 and 83 are formed by an in situ doped epitaxial deposition process. In an exemplary embodiment, the contact regions 82 and 83 are heavily doped with a second conductivity type dopant, e.g., heavily N doped (N+). After formation of the contact regions 82 and 83, the regions 22 and 23 of the partially fabricated integrated circuit 10 may be unmasked.

In FIG. 13, the method may continue with formation of contacts 86 to the contact regions 81, 82, and 83. To prevent contact formation on the exposed surface 30 of the semiconductor substrate 12, a mask (not shown) may be formed and patterned over the partially fabricated integrated circuit 10. Then, a contact formation process is performed. For example, a metal may be deposited over the partially fabricated integrated circuit 10 and an anneal process performed to cause silicidation at the contact regions 81, 82 and 83. An exemplary metal is nickel or another metal suitable for silicidation. As a result of silicidation, silicide contacts 86 are formed. Unreacted metal may then be removed.

FIG. 13 further illustrates opening of the control gate structure 46. Specifically, a portion of the cap 48 is removed to expose a surface of the control gate structure 46. Such removal may be performed by a selective etch. For example, for an exemplary cap 48 made of silicon nitride, and an etch selective to silicon nitride may be performed.

The method may include formation of various dielectric layers (not shown), including an interlayer dielectric material overlying the partially fabricated integrated circuit 10. Then, electrical connections may be made to the contact regions 81, 82 and 83 and to control gate structure 46, erase gate structure 72 and select gate structure 74, such as during back end of line (BEOL) processing. In an exemplary embodiment, contact region 81 and contact region 83 are well contacts. Electrical connections 90 are made to the contact regions 81 and 83 for selectively supplying a negative or positive voltage to the well regions 33 or 34 as desired. Further electrical connections are made to the gate structures 72, 46 and 74 as shown.

For example, an electrical connection 91 such as a bias line may be made to contact region 81, an electrical connection 92 such as a bias line may be made to contact region 83, an electrical connection 93 such as a drain line (DR) may be made to the erase gate structure 72, an electrical connection 94 such as a control gate line (CGL) may be made to the control gate structure 46, an electrical connection 95 such as a word line (WL) may be made to the select gate structure 74, and an electrical connection 96 such as a source line (SL) may be made to the contact region 82.

FIG. 13 illustrates a non-volatile memory structure 98 for which an erase operation may be performed with a lowered voltage as compared to conventional non-volatile memory structures. The non-volatile memory structure 98 of FIG. 13 includes a floating gate structure 60 directly overlying the first portion 31 of the central region 23, a control gate structure 46 directly overlying the floating gate structure 60, an erase gate structure 72 laterally adjacent the floating gate structure 60 and control gate structure 46 and directly overlying the first portion 31 of the central region 23, and a select gate structure 74 laterally adjacent the floating gate structure 60 and control gate structure 46 and directly overlying the second portion 32 of the central region 23. Further, the non-volatile memory structure 98 of FIG. 13 includes a source contact region 82 laterally adjacent the select gate structure 74 and directly overlying the second portion 32 of the central region 23 of the semiconductor substrate 12.

In the non-volatile memory structure 98 with the drain line (DR) 93 electrically connected to the erase gate structure 72, the source line (SL) 96 electrically connected to the source contact region 82, the word line (WL) 95 electrically connected to the select gate structure 74, and the control gate line (CGL) 94 electrically connected to the control gate structure 46, cell erase may be performed through poly-to-poly tunneling from the floating gate structure 60 to the erase gate structure 72. A reverse back bias voltage may be applied to well contact region 81 through bias line 91. A forward back bias voltage may be applied to well contact region 83 through bias line 92. Formation of the gate structures 72, 60, 46, and 74 over a fully or partially depleted semiconductor layer 18 and selective use of reverse and forward back biasing provides for use of a low voltage erase operation. During the program operation, electrons will go through the raised source/drain regions as conducting electrode. During erase operation, erase gate structure absorbs electrons from the floating gate structure. Thus, Poly-ONO-Poly tunneling implements the erase operation.

Figure 14:
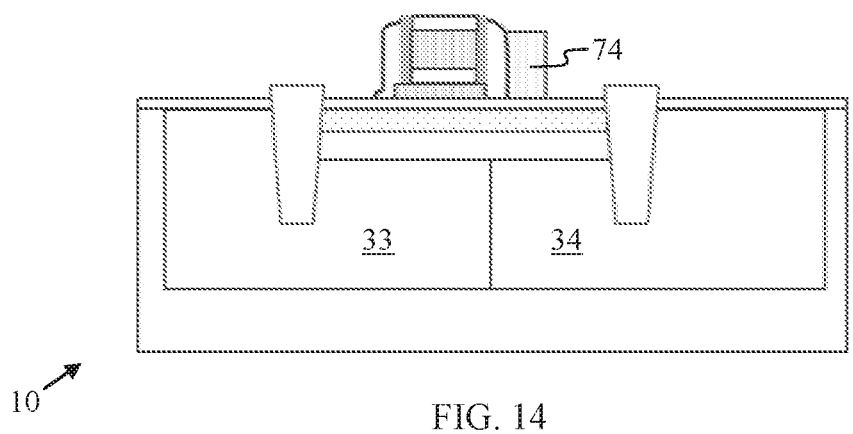
Figure 15:
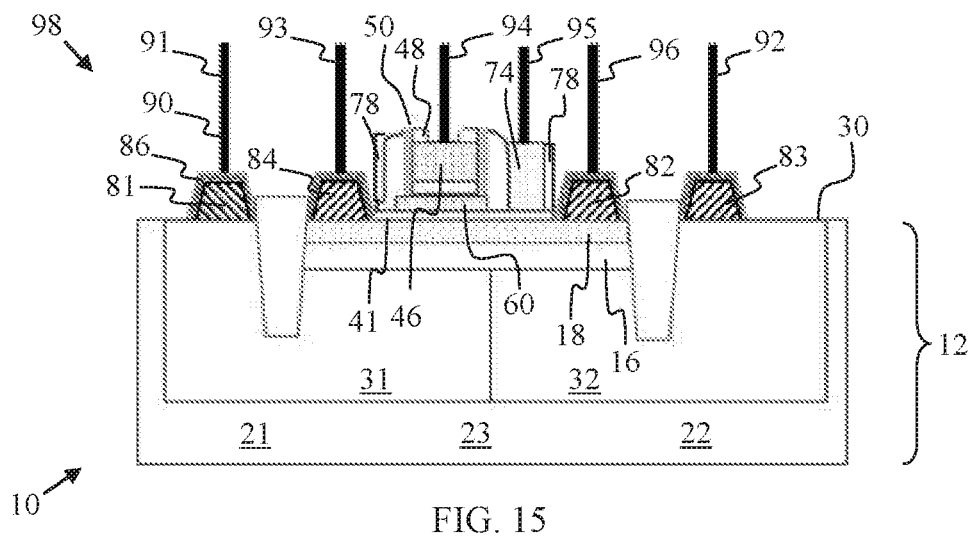

FIGS. 14-15 illustrate processing for forming another portion of the integrated circuit 10 that includes a non-volatile memory structure 98 suitable for an improved program operation. FIG. 14 illustrates processing of the structure of FIG. 12, in which the layer of gate electrode material is patterned to form a select gate structure 74. No erase gate structure 72 is formed.

In FIG. 15, the method further differs from that described in FIG. 13 with the formation of an additional contact region 84 adjacent spacer 78 along the stack of the control gate structure 46 and floating gate structure 60. As shown, contact region 84 is formed on the surface of the fully depleted upper layer 18 that is not covered by the spacer 78 or gate structures. In an exemplary embodiment, contact region 84 is silicon phosphorus (SiP). In an exemplary embodiment, the contact region 84 is a raised region formed by epitaxial deposition. Further, in an exemplary embodiment, the contact region 84 is formed by an in situ doped epitaxial deposition process. In an exemplary embodiment, the contact region 84 is heavily doped with a second conductivity type dopant, e.g., heavily N doped ($N^+$). Contact region 84 may be formed simultaneously with contact regions 82 and 83 during a same process. Alternatively, contact regions 82, 83 and 84 may be independently formed by masking and unmasking selected portions of second lateral region 22. An electrical connection 93 such as a source line (SL) may be made to the contact region 84 and an electrical connection 96 such as a drain line (DR) may be made to the contact region 82.

The non-volatile memory structure 98 of FIG. 15 includes a floating gate structure 60 directly overlying the first portion 31 of the central region 23, a control gate structure 46 directly overlying the floating gate structure 60, and a select gate structure 74 laterally adjacent the floating gate structure 60 and control gate structure 46 and directly overlying the second portion 32 of the central region 23. Further, the non-volatile memory structure 98 of FIG. 15 includes a drain contact region 82 laterally adjacent the select gate structure 74 and directly overlying the second portion 32 of the central region 23 of the semiconductor substrate 12 and a source contact region 84 laterally adjacent the floating gate structure 60 and control gate structure 46 and directly overlying the first portion 31 of the central region 23.

FIG. 15 illustrates a non-volatile memory structure 98 for which a program operation may be performed. In the non-volatile memory structure 98 of FIG. 15, with the bias line 91 electrically connected to the well contact region 81, bias line 92 electrically connected to the source contact region 82, source line (SL) 93 electrically connected to the source contact region 84, control gate line (CGL) 94 electrically connected to the control gate structure 46, word line (WL) 95 electrically connected to the select gate structure 74, and drain line (DR) 96 electrically connected to the drain contact region 82, different body back bias conditions (forward or reverse back bias) may be produced in the channel in the upper layer 18 under select gate structure 74 and floating gate structure 60. For example, during a program operation, back bias can be applied through the insulator layer 16 to further tune the electron behavior in the channel of the select gate structure 74 and floating gate structure 60 to improve source-side injection (SSI) program efficiency. Forward back bias can be applied on the select gate structure 74 to further lower the gate voltage (Vg) to obtain higher electron generation rate. Reverse back bias may be applied on the floating gate structure 60 channel region to help produce a larger vertical voltage difference in the floating gate structure 60 channel region, which will boost the hot channel injection (HCI) efficiency.

As described herein, integrated circuits with non-volatile memory structures are provided. Exemplary non-volatile memory structures are formed over a FDSOI channel region and are provided with well contacts. As described, the exemplary non-volatile memory structures achieve improved program and erase performance through forward and reverse back biasing through the well contacts.

The back bias flash scheme on FDSOI can enlarge the program/erase threshold voltage (Vt) window and improve the endurance performance of flash memory devices. The introduction of the body back bias scheme applied on the floating gate channel provides for selectively micro-tuning the Vt/electric field condition of specific flash memory devices under a fixed implant condition. Further, the cycle time of the flash memory device may be increase and the flash performance may be optimized by using different back bias conditions.

Also, forward back bias applied in the select gate channel during the program operation can further lower the gate voltage (Vg) to switch on the select gate transistor, which can help to obtain the most optimized and favored voltage condition for electron generation. Applying reverse back bias in the control gate/floating gate channel facilitates production of a higher vertical field component in the floating gate channel and enhances the source-side injection (SSI) program efficiency Applying reverse back bias to the well region 34 also enables the reduction of Vs from about 4.5V to about 2V. In a channel initiated secondary electron (CHISEL) injection process, an increase in hot electron generation allows the structure to avoid gate-to-SL breakdown voltage (BV) or time dependent dielectric breakdown (TDDB), a well-known issue for raised source/drain regions, during the program operation. Further, the well contact serves as a direct channel to absorb the programming-produced holes in the body near the insulator layer to prevent a potential kink effect caused by holes accumulation.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit comprising:
   a semiconductor substrate having a central semiconductor-on-insulator (SOI) region between a first non-SOI region and a second non-SOI region, wherein the semiconductor substrate includes a semiconductor base in the central SOI region and the non-SOI regions, an insulator layer overlying the semiconductor base in the central SOI region, and an upper semiconductor layer overlying the insulator layer in the central SOI region;
   a first conductivity type well formed in the semiconductor base in the first non-SOI region and in a first portion of the central SOI region;
   a second conductivity type well formed in the semiconductor base in the second non-SOI region and in a second portion of the central SOI region lateral of the first conductivity type well; and
   a non-volatile memory device structure overlying the upper semiconductor layer in the central SOI region.

2. The integrated circuit of claim 1 wherein the upper semiconductor layer is fully depleted.

3. The integrated circuit of claim 1 wherein the upper semiconductor layer is partially depleted.

4. The integrated circuit of claim 1 further comprising a second conductivity type deep well formed in the semiconductor base in the first non-SOI region, in the central SOI region, and in the second non-SOI region, wherein the first conductivity type well and the second conductivity type well lie over the second conductivity type deep well.

5. The integrated circuit of claim 1 further comprising:
a first well contact over the first conductivity type well in the first non-SOI region; and
a second well contact over the second conductivity type well in the second non-SOI region.

6. The integrated circuit of claim 1 further comprising:
a first isolation region in the first conductivity type well, wherein the first isolation region separates an upper portion of the first non-SOI region from an upper portion of the central SOI region; and
a second isolation region in the second conductivity type well, wherein the second isolation region separates an upper portion of the second non-SOI region from the upper portion of the central SOI region, and wherein the insulator layer and the upper semiconductor layer extend from the first isolation region to the second isolation region.

7. The integrated circuit of claim 6 further comprising:
a first well contact on the first conductivity type well in the first non-SOI region; and
a second well contact on the second conductivity type well in the second non-SOI region.

8. The integrated circuit of claim 1 wherein the non-volatile memory device structure comprises:
a floating gate overlying the upper semiconductor layer;
a control gate overlying the floating gate; and
a select gate laterally adjacent the floating gate and control gate.

9. The integrated circuit of claim 1 wherein the non-volatile memory device structure comprises:
a floating gate directly overlying the first portion of the central SOI region;
a control gate directly overlying the floating gate; and
a select gate laterally adjacent the floating gate and control gate and directly overlying the second portion of the central SOI region.

10. The integrated circuit of claim 1 wherein the non-volatile memory device structure comprises:
a floating gate directly overlying the first portion of the central SOI region;
a control gate directly overlying the floating gate; and
a select gate laterally adjacent the floating gate and control gate and directly overlying the second portion of the central SOI region,
wherein the integrated circuit further comprises:
a drain contact region laterally adjacent the select gate and directly overlying the second portion of the central SOI region;
a source contact region laterally adjacent the floating gate and control gate and directly overlying the first portion of the central SOI region;
a drain line (DR) electrically connected to the drain contact region;
a source line (SL) electrically connected to the source contact region;
a word line (WL) electrically connected to the select gate; and
a control gate line (CGL) electrically connected to the control gate.

11. The integrated circuit of claim 1 wherein the non-volatile memory device structure comprises:
a floating gate directly overlying the first portion of the central SOI region;
a control gate directly overlying the floating gate; and
a select gate laterally adjacent the floating gate and control gate and directly overlying the second portion of the central SOI region; and
an erase gate laterally adjacent the floating gate the control gate and directly overlying the first portion of the central SOI region.

12. The integrated circuit of claim 1 wherein the non-volatile memory device structure comprises:
a floating gate directly overlying the first portion of the central SOI region;
a control gate directly overlying the floating gate; and
a select gate laterally adjacent the floating gate and control gate and directly overlying the second portion of the central SOI region; and
an erase gate laterally adjacent the floating gate the control gate and directly overlying the first portion of the central SOI region;
wherein the integrated circuit further comprises:
a source contact region laterally adjacent the select gate and directly overlying the second portion of the central SOI region;
a drain line (DR) electrically connected to the erase gate;
a source line (SL) electrically connected to the source contact region;
a word line (WL) electrically connected to the select gate; and
a control gate line (CGL) electrically connected to the control gate.

13. An integrated circuit comprising:
a semiconductor base having a first region, a second region, and a central region located between the first region and the second region;
an insulator layer directly overlying the central region of the semiconductor base;
an upper semiconductor layer directly overlying the insulator layer;
a first lateral semiconductor layer directly overlying the first region of the semiconductor base;
a second lateral semiconductor layer directly overlying the second region of the semiconductor base, wherein the first lateral, upper, and second lateral semiconductor layers define an upper surface;
a first isolation region extending from the upper surface and into the semiconductor base and insulating the upper semiconductor layer from the first lateral semiconductor layer; a second isolation region extending from the upper surface and into the semiconductor base and insulating the upper semiconductor layer from the second lateral semiconductor layer; and
a non-volatile memory device structure directly overlying the upper semiconductor layer.

14. The integrated circuit of claim 13 further comprising:
a second conductivity type deep well in the semiconductor base in the first, central and second regions;
a first conductivity type well in the first lateral semiconductor layer, in the semiconductor base in the first region and in a first portion of the central region and directly overlying the second conductivity type deep well; and
a second conductivity type well in the second lateral semiconductor layer, in the semiconductor base in the second region and in a second portion of the central region and directly overlying the second conductivity type deep well.

15. The integrated circuit of claim 14 further comprising:
  a first well contact on the first conductivity type well in the first lateral semiconductor layer; and
  a second well contact on the second conductivity type well in the second lateral semiconductor layer.

16. The integrated circuit of claim 15 wherein the non-volatile memory device structure comprises:
  a floating gate directly overlying the first portion of the central region;
  a control gate directly overlying the floating gate; and
  a select gate laterally adjacent the floating gate and control gate and directly overlying the second portion of the central region;
wherein the integrated circuit further comprises:
  a drain contact region laterally adjacent the select gate and directly overlying the second portion of the central region;
  a source contact region laterally adjacent the floating gate and control gate and directly overlying the first portion of the central region;
  a drain line (DR) electrically connected to the drain contact region;
  a source line (SL) electrically connected to the source contact region;
  a word line (WL) electrically connected to the select gate; and
  a control gate line (CGL) electrically connected to the control gate.

17. The integrated circuit of claim 15 wherein the non-volatile memory device structure comprises:
  a floating gate directly overlying the first portion of the central region;
  a control gate directly overlying the floating gate; and
  a select gate laterally adjacent the floating gate and control gate and directly overlying the second portion of the central region; and
  an erase gate laterally adjacent the floating gate the control gate and directly overlying the first portion of the central region;
wherein the integrated circuit further comprises:
  a source contact region laterally adjacent the select gate and directly overlying the second portion of the central region;
  a drain line (DR) electrically connected to the erase gate;
  a source line (SL) electrically connected to the source contact region;
  a word line (WL) electrically connected to the select gate; and
  a control gate line (CGL) electrically connected to the control gate.

18. A method for fabricating an integrated circuit, the method comprising:
  providing a semiconductor-on-insulator (SOI) substrate including a semiconductor base, an insulator layer overlying the semiconductor base, and an upper semiconductor layer overlying the insulator layer, wherein the SOI substrate has a first region, a second region, and a central region between the first region and the second region;
  removing the upper semiconductor layer and the insulator layer from the first and second regions;
  forming a first isolation region at a first end of the upper semiconductor layer and the insulator layer and a second isolation region at a second end of the upper semiconductor layer and the insulator layer;
  doping the semiconductor base in the first region and a first portion of the semiconductor base in the central region with a first conductivity type dopant;
  doping the semiconductor base in the second region and a second portion of the semiconductor base in the central region with a second conductivity type dopant; and
  forming a non-volatile memory device structure directly overlying the upper semiconductor layer.

19. The method of claim 18 further comprising forming a raised source/drain region directly overlying the upper semiconductor layer.

20. The method of claim 19 further comprising:
  growing epitaxial semiconductor material in the first region and in the second region;
  forming a first well contact on the epitaxial semiconductor material in the first region; and
  forming a second well contact on the epitaxial semiconductor material in the second region.

* * * * *